(12) United States Patent
Oda et al.

(10) Patent No.: US 11,011,557 B2
(45) Date of Patent: May 18, 2021

(54) SOLID-STATE IMAGING DEVICE (71) Applicant: Tower Partners Semiconductor Co., Ltd., Uozu (JP)

(72) Inventors: Masahiro Oda, Hyogo (JP); Hirohisa Otsuki, Hyogo (JP)

(73) Assignee: Tower Partners Semiconductor Co., Ltd., Uozu (JP)

( * ) Notice: Subject to any disclaimer, the term of this patent is extended or adjusted under 35 U.S.C. 154(b) by 422 days.

(21) Appl. No.: 15/940,658

(22) Filed: Mar. 29, 2018

(65) Prior Publication Data

US 2018/0226439 A1 Aug. 9, 2018

Related U.S. Application Data

(63) Continuation of application No. PCT/JP2016/001812, filed on Mar. 29, 2016.

(30) Foreign Application Priority Data

Sep. 29, 2015 (JP) .............................. JP2015-190803

(51) Int. Cl.
*H01L 27/146* (2006.01)
*H04N 5/369* (2011.01)
(Continued)

(52) U.S. Cl.
CPC .......... *H01L 27/14605* (2013.01); *G01C 3/06* (2013.01); *G01S 7/4863* (2013.01); *G01S 7/4865* (2013.01); *G01S 17/08* (2013.01); *H01L 27/14609* (2013.01); *H01L 27/14623* (2013.01); *H01L 27/14643* (2013.01); *H04N 5/369* (2013.01); *H04N 5/374* (2013.01); *H01L 27/1463* (2013.01); *H01L 27/14627* (2013.01);
(Continued)

(58) Field of Classification Search
CPC ................................................. H01L 27/14609
See application file for complete search history.

(56) References Cited

U.S. PATENT DOCUMENTS

2008/0079833 A1 4/2008 Ichikawa et al.
2012/0175685 A1 7/2012 Kim et al.
(Continued)

FOREIGN PATENT DOCUMENTS

EP 2180513 A1 4/2010
JP 200889346 A 4/2008
(Continued)

OTHER PUBLICATIONS

International Search Report dated Jun. 14, 2016 re: Application No. PCT/JP2016/001812, pp. 2, citing: US 2014/0252437 A1 and WO 2007/119626 A1.

*Primary Examiner* — Thanh Luu
(74) *Attorney, Agent, or Firm* — Knobbe, Martens, Olson & Bear, LLP (57) ABSTRACT

A plurality of pixels are two-dimensionally arranged on a semiconductor substrate. Each of the pixels includes: two photodiodes each generating charge by photoelectric conversion; first and second memories spaced apart from each other between the two photodiodes as viewed in cross section; a first readout gate reading charge from the two photodiodes to the first memory; and a second readout gate reading charge from the two photodiodes to the second memory.

8 Claims, 8 Drawing Sheets

(51) Int. Cl.
  *G01C 3/06* (2006.01)
  *H04N 5/374* (2011.01)
  *G01S 7/4863* (2020.01)
  *G01S 7/4865* (2020.01)
  *G01S 17/08* (2006.01)
  *H04N 5/378* (2011.01)
(52) U.S. Cl.
  CPC ........ *H01L 27/14636* (2013.01); *H04N 5/378* (2013.01)

(56) References Cited

U.S. PATENT DOCUMENTS

2013/0214128 A1\* 8/2013 Yamashita ........... H04N 5/3696
 250/208.1
2014/0252437 A1 9/2014 Oh et al.

FOREIGN PATENT DOCUMENTS

| | | |
|---|---|---|
| JP | 2008103647 A | 5/2008 |
| JP | 2011133464 A | 7/2011 |
| JP | 2012217059 A | 11/2012 |
| JP | 201384851 A | 5/2013 |
| JP | 2013172210 A | 9/2013 |
| JP | 2014-033054 A | 2/2014 |
| JP | 201433054 A | 2/2014 |
| WO | 2007119626 A1 | 10/2007 |

\* cited by examiner

SOLID-STATE IMAGING DEVICE

CROSS-REFERENCE TO RELATED APPLICATIONS

This is a continuation of International Application No. PCT/JP2016/001812 filed on Mar. 29, 2016, which claims priority to Japanese Patent Application No. 2015-190803 filed on Sep. 29, 2015. The entire disclosures of these applications are incorporated by reference herein.

BACKGROUND

The present disclosure relates to a solid state imaging device that can be used for distance measurement.

Solid state imaging devices known in the art use a time of flight (TOF) technique for distance measurement. Such a solid state imaging device detects an image of light reflected from an object irradiated with pulsed light from a light emitting diode (LED), and obtains distance information based on a delay time of the reflected light with respect to the irradiation light.

Specifically, a pixel structure called a charge distribution structure, for example, is used. In this structure, a plurality of capacitors are connected to a single photodiode generating charge by photoelectric conversion. Charges are read from the photodiode at different timings in synchronization with light emission from an LED, and the read charges are separately accumulated in the capacitors. The distance to an object is calculated based on the amount of the charges accumulated in the capacitors (see Japanese Unexamined Patent Publication No. 2008-89346).

SUMMARY

The known charge distribution pixel structure includes a large photodiode. This prevents an electric field for reading charge from the photodiode from being effectively formed. In addition, the distance over which charge travels from the photodiode is long. The foregoing factors make it difficult to read charge from the photodiode within a sufficiently short time relative to the TOF.

It is an object of the present disclosure to increase the speed at which charge is read from a photodiode of a solid state imaging device.

According to the present disclosure, a photodiode forming part of a single pixel is divided into a plurality of smaller photodiodes, between each adjacent pair of which a plurality of memories are interposed to accumulate charge.

A solid state imaging device according to an aspect of the present disclosure includes a plurality of pixels which are two-dimensionally arranged on a semiconductor substrate, each of the pixels including: two photodiodes each generating charge by photoelectric conversion; first and second memories spaced apart from each other between the two photodiodes as viewed in cross section; a first readout gate reading charge from the two photodiodes to the first memory; and a second readout gate reading charge from the two photodiodes to the second memory.

Driving the first readout gate allows a portion of the charge generated by each of the two photodiodes to be read, at high speed, into the first memory interposed between the two photodiodes. Driving the second readout gate at a different timing from the timing at which the first readout gate is driven allows another portion of the charge generated by each of the two photodiodes to be read, at high speed, into the second memory interposed between the two photodiodes.

According to the present disclosure, a photodiode forming part of a single pixel is divided into a plurality of smaller photodiodes, between each adjacent pair of which a plurality of memories are interposed to accumulate charge. This reduces the distance over which charge travels from each photodiode to an associated one of the memories. As a result, the speed at which charge is read from the photodiode of a solid state imaging device can be increased.

DETAILED DESCRIPTION

Figure 1:
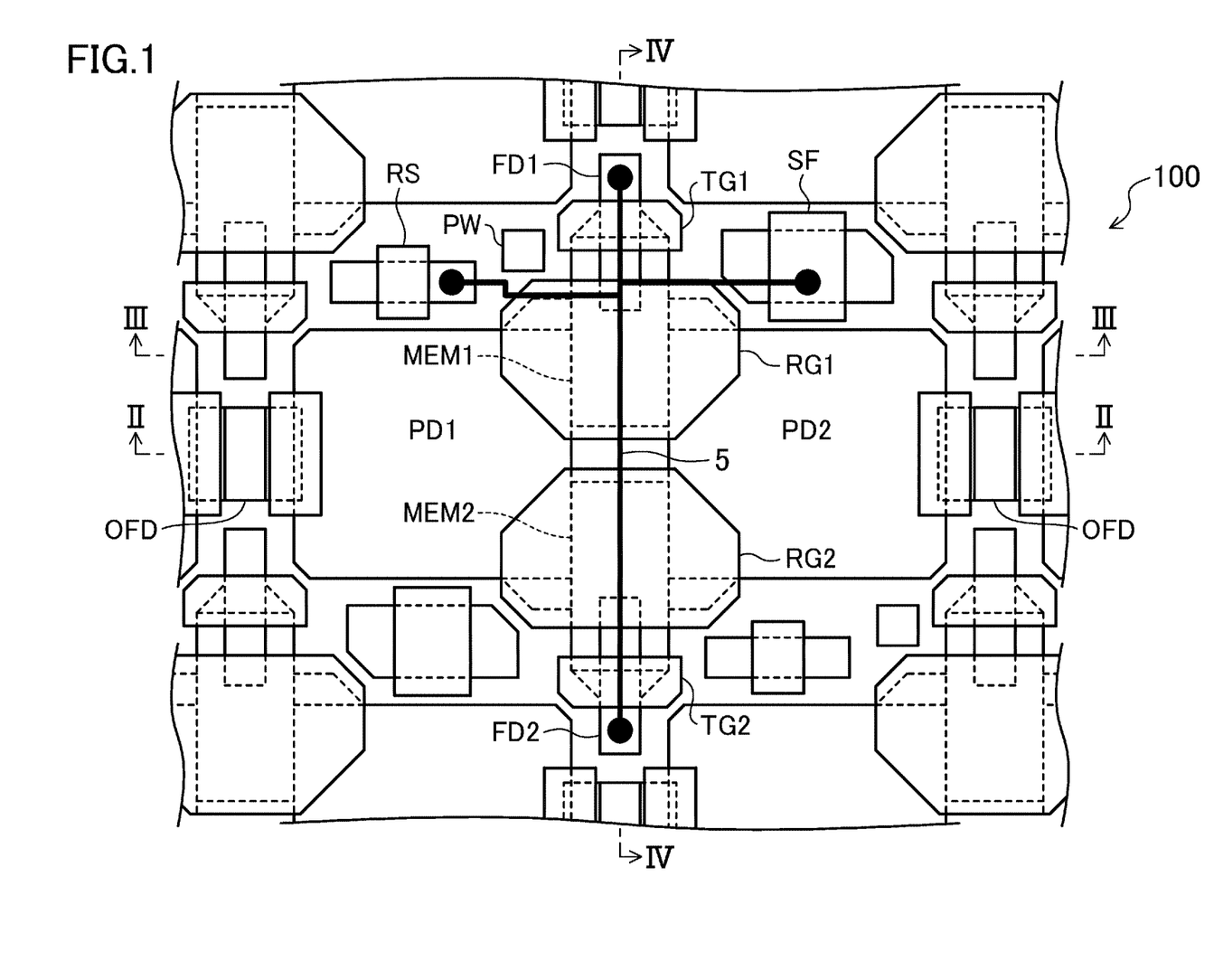
FIG. 1 is a plan view showing a pixel structure of a solid state imaging device according to an embodiment of the present disclosure.

FIG. 1 is a plan view showing a pixel structure of a solid state imaging device according to an embodiment of the present disclosure. The solid state imaging device shown in FIG. 1 includes a plurality of pixels which are two-dimensionally arranged on a semiconductor substrate. FIG. 1 shows one rectangular pixel 100 having an aspect ratio of substantially 1:2, and other pixels arranged in a staggered manner around the pixel 100. The other pixels also have a shape and a structure identical or similar to those of the pixel 100 shown in detail in FIG. 1.

The pixel 100 includes first and second photodiodes PD1 and PD2, first and second memories MEM1 and MEM2, first and second readout gates RG1 and RG2, overflow drains OFDs, first and second floating diffusion portions FD1 and FD2, first and second transfer gates TG1 and TG2, a reset transistor RS, and a source follower (an amplifier transistor) SF. The first and second floating diffusion portions FD1 and FD2, the drain of the reset transistor RS, and the gate of the source follower SF are connected together through a metal interconnect 5.

The first and second photodiodes PD1 and PD2 are devices generating charge by photoelectric conversion, and are spaced apart from each other. The first and second memories MEM1 and MEM2 are spaced apart from each other between the first and second photodiodes PD1 and PD2 as viewed in cross section. The first readout gate RG1 is a polysilicon layer, and overlaps with the borders between the first memory MEM1 and the first and second photodiodes PD1 and PD2 to read charge from the first and second photodiodes PD1 and PD2 to the first memory MEM1. The second readout gate RG2 is a polysilicon layer, and overlaps with the borders between the second memory MEM2 and the first and second photodiodes PD1 and PD2 to read charge from the first and second photodiodes PD1 and PD2 to the second memory MEM2. The overflow drains OFDs each discharge a surplus of charge from an associated one of the first and second photodiodes PD1 and PD2, and are each provided on a side of the associated one of the first and second photodiodes PD1 and PD2 remote from the first and second memories MEM1 and MEM2.

The first and second floating diffusion portions FD1 and FD2 are adjacent to the first and second memories MEM1 and MEM2, respectively. The first transfer gate TG1 is a polysilicon layer, and is used to transfer charge from the first memory MEM1 to the first floating diffusion portion FD1. The second transfer gate TG2 is a polysilicon layer, and is used to transfer charge from the second memory MEM2 to the second floating diffusion portion FD2.

The reset transistor RS is used to reset charge accumulated in the first and second floating diffusion portions FD1 and FD2. The source follower RS is a transistor configured to output a voltage signal in response to the charge accumulated in the first and second floating diffusion portions 1-D1 and FD2. The reference character PW in FIG. 1 denotes a contact to a p-well provided in an n-type semiconductor substrate.

Figure 2:
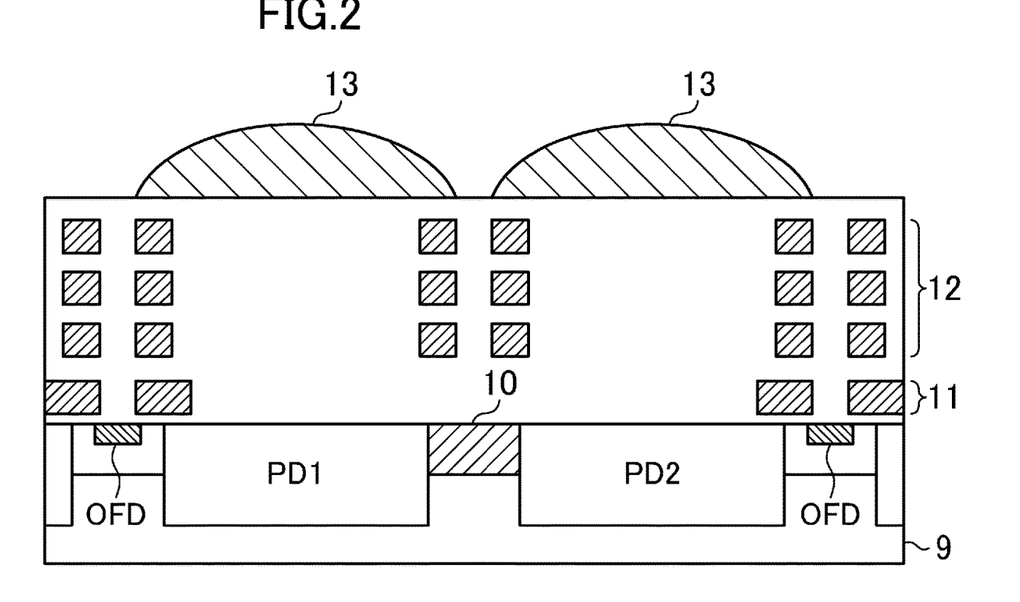
FIG. 2 is a cross-sectional view taken along line II-II shown in FIG. 1.

FIG. 2 is a cross-sectional view taken along line II-II shown in FIG. 1. The first and second silicon photodiodes PD1 and PD2 are formed in a surface of a semiconductor substrate 9 made of silicon with an isolation region 10 interposed therebetween as a shallow trench isolation (STI) region. Diffusion layers serving as the overflow drains OFDs are formed outward of the first and second photodiodes PD1 and PD2, respectively. A polysilicon layer 11 forming various gates, and metal interconnect layers 12 are sequentially formed on the surface of the semiconductor substrate 9. Furthermore, lenses 13 (not shown in FIG. 1) are provided to effectively concentrate light onto the first and second photodiodes PD1 and PD2.

Figure 3:
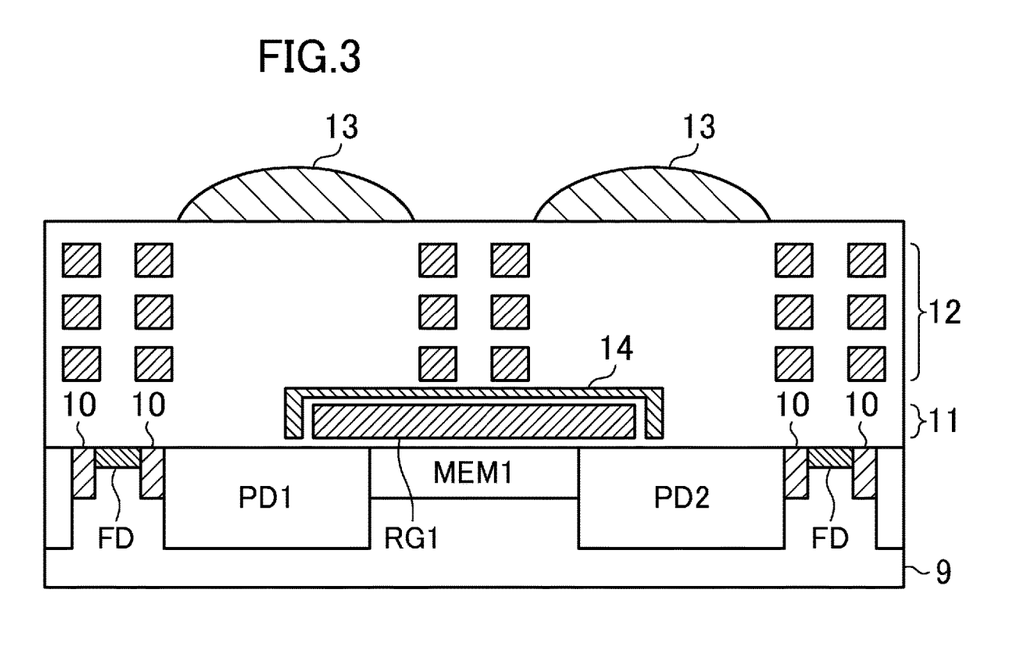
FIG. 3 is a cross-sectional view taken along line III-III shown in FIG. 1.

FIG. 3 is a cross-sectional view taken along line III-III shown in FIG. 1. As shown in FIG. 3, the first memory MEM1 is formed between the first and second photodiodes PD1 and PD2 as viewed in cross section. The first readout gate RG1 is formed as a portion of the polysilicon layer 11 overlapping with the borders between the first memory MEM1 and the first and second photodiodes PD1 and PD2. Furthermore, to prevent light from entering the first memory MEM1, a light blocking film 14 (not shown in FIG. 1) is made of, for example, tungsten or tungsten nitride, and covers upper and side surfaces of the first readout gate RG1. Two floating diffusion portions "FDs" shown in FIG. 3 are each a floating diffusion portion of an adjacent pixel.

Figure 4:
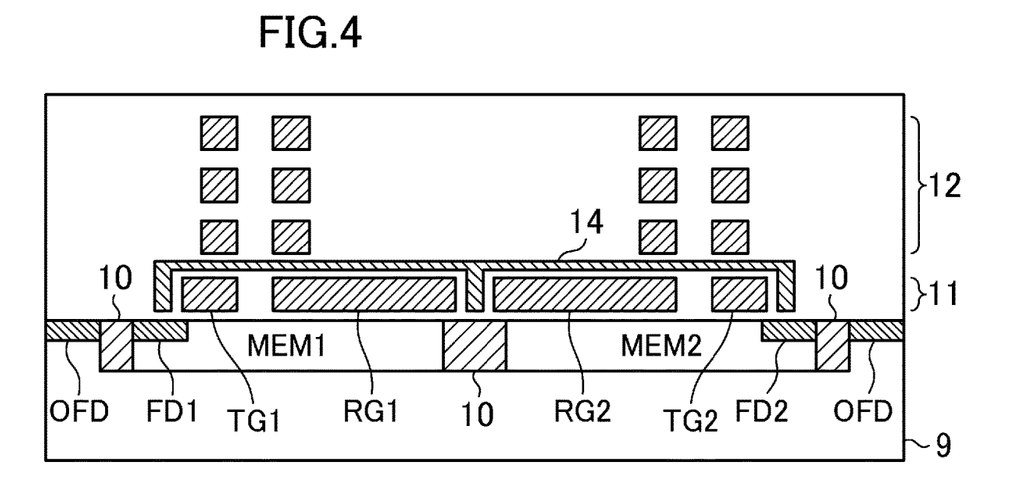
FIG. 4 is a cross-sectional view taken along line IV-IV shown in FIG. 1.

FIG. 4 is a cross-sectional view taken along line IV-IV shown in FIG. 1. The first and second memories MEM1 and MEM2 are formed in the surface of the semiconductor substrate 9 with the isolation region 10 as an STI region interposed therebetween. The first and second floating diffusion portions FD1 and FD2 are adjacent to the first and second memories MEM1 and MEM2, respectively. The first transfer gate TG1 is a portion of the polysilicon layer 11, and is used to transfer charge from the first memory MEM1 to the first floating diffusion portion FD1. The second transfer gate TG2 is a portion of the polysilicon layer 11, and is used to transfer charge from the second memory MEM2 to the second floating diffusion portion FD2.

Figure 5:
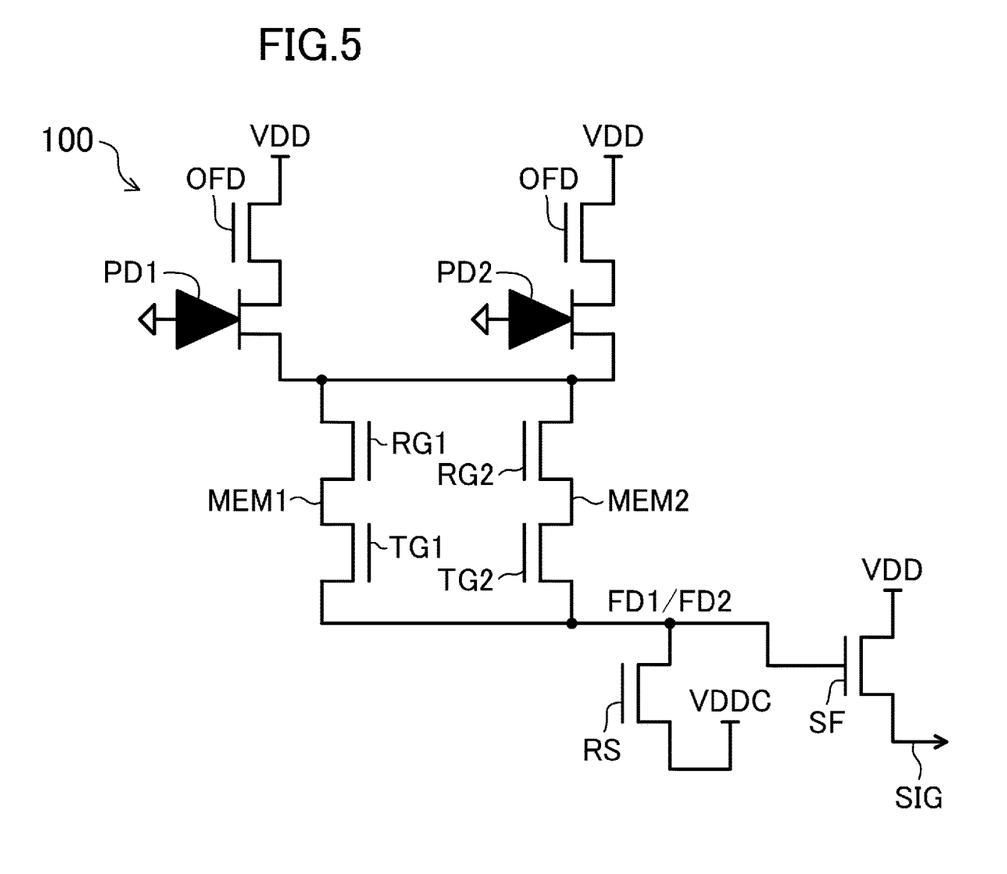
FIG. 5 is a circuit diagram of a single pixel of the solid state imaging device shown in FIG. 1.

FIG. 5 is a circuit diagram of the single pixel 100 of the solid state imaging device shown in FIG. 1. The first and second photodiodes PD1 and PD2 are each connected through an associated one of the overflow drains OFDs to a power supply VDD. The first and second photodiodes PD1 and PD2 are connected through the first and second readout gates RG1 and RG2 to the first and second memories MEM1 and MEM2, respectively. The first and second memories MEM1 and MEM2 are connected through the first and second transfer gates TG1 and TG2 to the first and second floating diffusion portions FD1 and FD2, respectively. In this embodiment, the first and second floating diffusion portions FD1 and FD2 are connected together through the metal interconnect 5 as described above, and are thus shown in FIG. 5 as a single floating diffusion portion FD1/FD2. This floating diffusion portion FD1/FD2 is connected to a power supply VDDC through the reset transistor RS, and is connected also to the gate of the source follower SF. The source follower SF is a transistor interposed between the power supply VDD and a signal line SIG.

Figure 6:
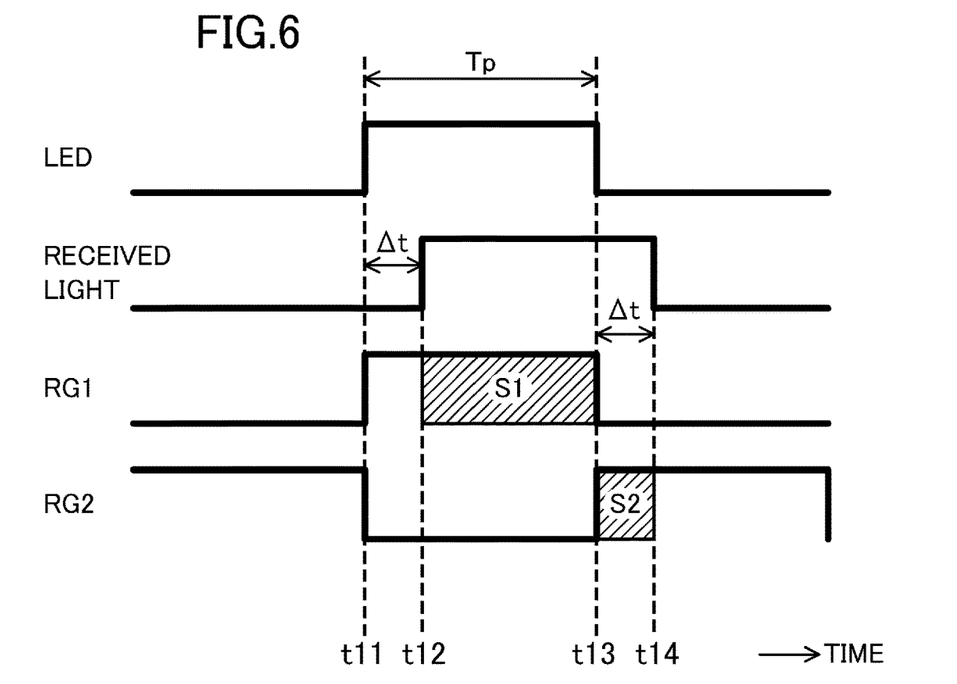
FIG. 6 is a timing diagram for explaining the principle of how the solid state imaging device shown in FIG. 1 measures the distance to an object.

FIG. 6 is a timing diagram for explaining the principal of how the solid state imaging device shown in FIG. 1 measures the distance to an object. In this embodiment, L is the distance from an LED to an object to which pulsed light is emitted from the LED, and Tp is the period of time during which the LED is in an on state, i.e., the period of time from a time t11 to a time t13. The light emitted travels over the distance 2 L at a speed c (=3.0×108 m/s) before returning to the solid state imaging device by being reflected off the object. Thus, the following formula (1) holds.

$$L = c \times (\Delta t / 2) \tag{1}$$

where $\Delta t$ is a delay period of time of received light with respect to the light emitted. A pulse of the received light rises at the time t12 at which the period of time $\Delta t$ elapses since the time t11, and falls at the time t14 at which the period of time $\Delta t$ elapses since the time t13. Thus, the first and second photodiodes PD1 and PD2 generate charge by photoelectric conversion only from the time t12 to the time t14.

Meanwhile, the first readout gate RG1 is opened only during the period of time Tp from the time t11 to the time t13, and the second readout gate RG2 only during a period of time starting from the time t13 and being equal to the period of time Tp. In this case, the following relation holds.

$$\Delta t / Tp = S2 / (S1 + S2) \tag{2}$$

where S1 is the amount of charge read via the first readout gate RG1 to the first memory MEM1, and S2 is the amount of charge read via the second readout gate RG2 to the second memory MEM2. The following formula holds based on the formulae (1) and (2).

$$L = (c \times Tp)/2 \times S2/(S1+S2) \tag{3}$$

That is to say, the distance L to the object can be determined based on the amounts S1 and S2 of charge distributed to the first and second memories MEM1 and MEM2.

Figure 7:
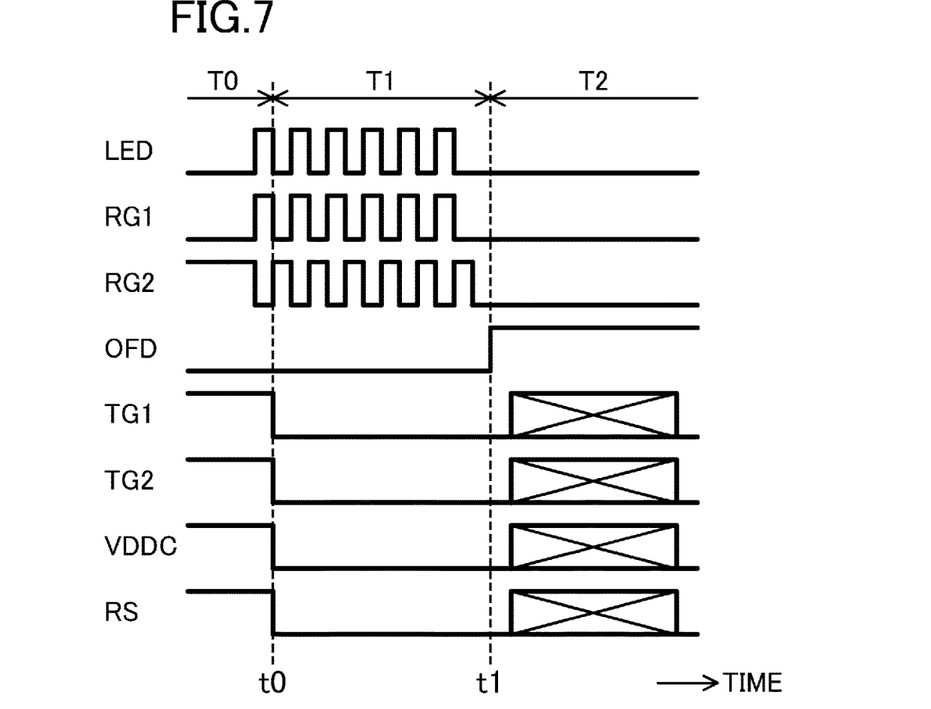
FIG. 7 is a timing diagram for explaining how the solid state imaging device shown in FIG. 1 operates.

FIG. 7 is a timing diagram for explaining how the solid state imaging device shown in FIG. 1 operates. A period of time to a time t0 is a reset period of time T0, a period of time from the time t0 to a time t1 is a signal accumulation period of time T1, and a signal reading period of time T2 starts from the time t1.

During the reset period of time T0, the overflow drains OFD are off, the first and second transfer gates TG1 and TG2 are on, the power supply VDDC is on, and the reset transistor RS is on. Next, the LED is blinked, and the first and second readout gates RG1 and RG2 are alternately driven by pulses. During this period of time, the charges generated in the first and second photodiodes PD1 and PD2 flow to the first and second memories MEM0 and MEM1, respectively. However, since the first and second transfer gates TG1 and TG2 are on, the charges flow through the reset transistor RS to the power supply VDDC without being accumulated in the first and second memories MEM1 and MEM2.

Next, the first and second transfer gates TG1 and TG2, the power supply VDDC, and the reset transistor RS are all turned off. From this time, the signal accumulation period of time T1 starts. During the signal accumulation period of time T1, the LED blinks. The reflected LED light is photoelectrically converted by the first and second photodiodes PD1 and PD2. During this period of time, since the first and second readout gates RG1 and RG2 are alternately driven by pulses, the charges generated in the first and second photodiodes PD1 and PD2 are distributed to the first and second memories MEM1 and MEM2 in accordance with the length of the delay period of time Δt described above. This charge distribution operation is preferably repeated multiple times. Consequently, needed signal charges S1 and S2 are accumulated in the first and second memories MEM1 and MEM2, respectively.

Next, the first and second readout gates RG1 and RG2 stop being driven by pulses, and the overflow drains OFDs are turned on. From this time, the signal reading period of time T2 starts. During the signal reading period of time T2, charge is selectively transferred to the floating diffusion portion FD1/FD2 through control over the first and second transfer gates TG1 and TG2. Specifically, opening the first transfer gate TG1 allows charge accumulated in the first memory MEM1 to be transferred to the floating diffusion portion FD1/FD2, whereas opening the second transfer gate TG2 allows charge accumulated in the second memory MEM2 to be transferred to the floating diffusion portion FD1/FD2. The detailed description of driving during the signal reading period of time T2 will be omitted.

As can be seen from the foregoing description, according to this embodiment, a photodiode forming part of the single pixel 100 is divided into the two smaller photodiodes PD1 and PD2, between which the two memories MEM1 and MEM2 are interposed to accumulate charge. This reduces the distance over which charge travels from each of the photodiodes PD1, PD2 to an associated one of the memories MEM1 and MEM2. As a result, the speed at which charge is read from the photodiode PD1, PD2 increases.

In addition, arranging a plurality of pixels in a staggered manner improves the area efficiency. This allows the photodiodes PD1 and PD2 and the memories MEM1 and MEM2 to have a large area. Thus, more signal charges can be handled.

Furthermore, the first and second floating diffusion portions FD1 and FD2 to each of which an associated one of the two transfer gates TG1 and TG2 selectively transfers signal charge are connected together through the metal interconnect 5, and the source follower SF serving as an amplifier transistor for signal output is connected to the first and second floating diffusion portions FD1 and FD2 in common. This can reduce variations in output signal, thus achieving more accurate distance measurement.

In this embodiment, the readout gates RG1 and RG2 are disposed over the entire upper surfaces of the memories MEM1 and MEM2, respectively. However, the readout gates RG1 and RG2 may each overlap with only the borders between an associated one of the memories MEM1 and MEM2 and the photodiodes PD1 and PD2.

A STI region is used as the isolation region 10. However, the isolation region 10 may be formed by implantation. The semiconductor substrate 9 should not be limited to an n-type substrate, but may be a p-type substrate.

An on-chip color filter layer may be embedded in an opening of one of the metal interconnect layers 12, may be interposed between one of the metal interconnect layers 12 and the lenses 13, or may cover the lenses 13.

Figure 8:
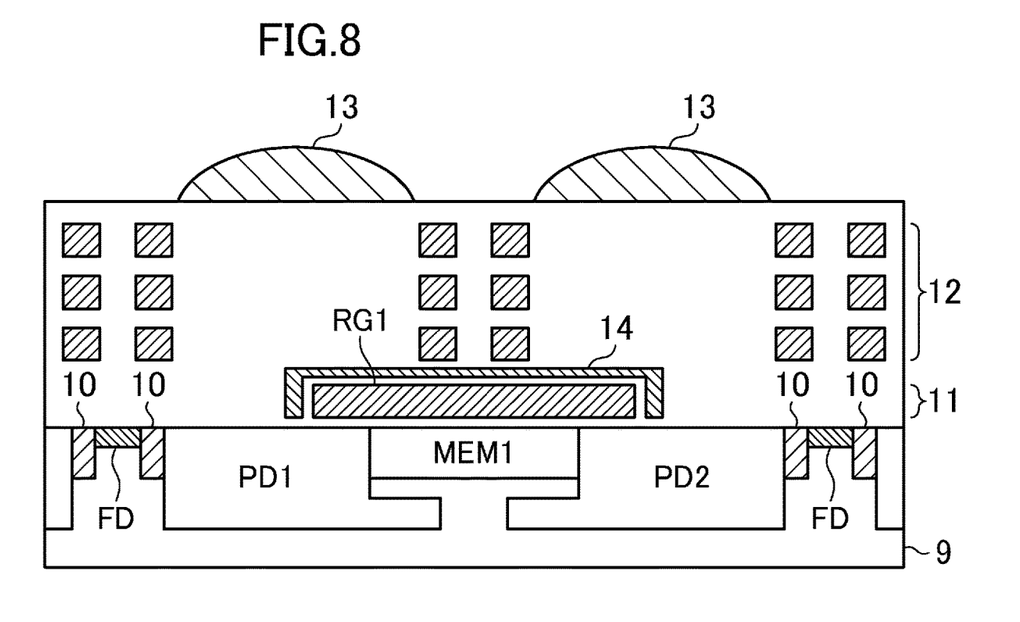
FIG. 8 is a cross-sectional view of a variation of the pixel structure shown in FIG. 3.

FIG. 8 is a cross-sectional view showing a variation of the pixel structure shown in FIG. 3. As shown in FIG. 8, photodiodes PD1 and PD2 may each extend under memories MEM1 and MEM2. Such a configuration allows the photodiodes PD1 and PD2 to each have its area increased.

Figure 9:
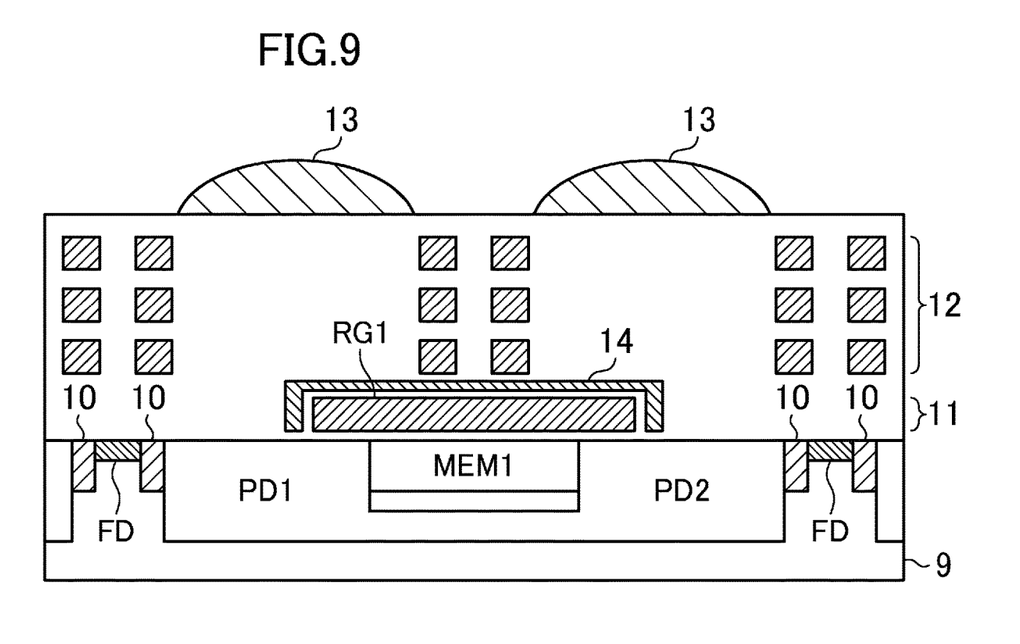
FIG. 9 is a cross-sectional view of a variation of the pixel structure shown in FIG. 3.

FIG. 9 is a cross-sectional view showing another variation of the pixel structure shown in FIG. 3. In the example shown in FIG. 9, two photodiodes PD1 and PD2 are connected together through a region under the memories MEM1 and MEM2. Such a configuration allows the photodiodes PD1 and PD2 to each have its area further increased.

Figure 10:
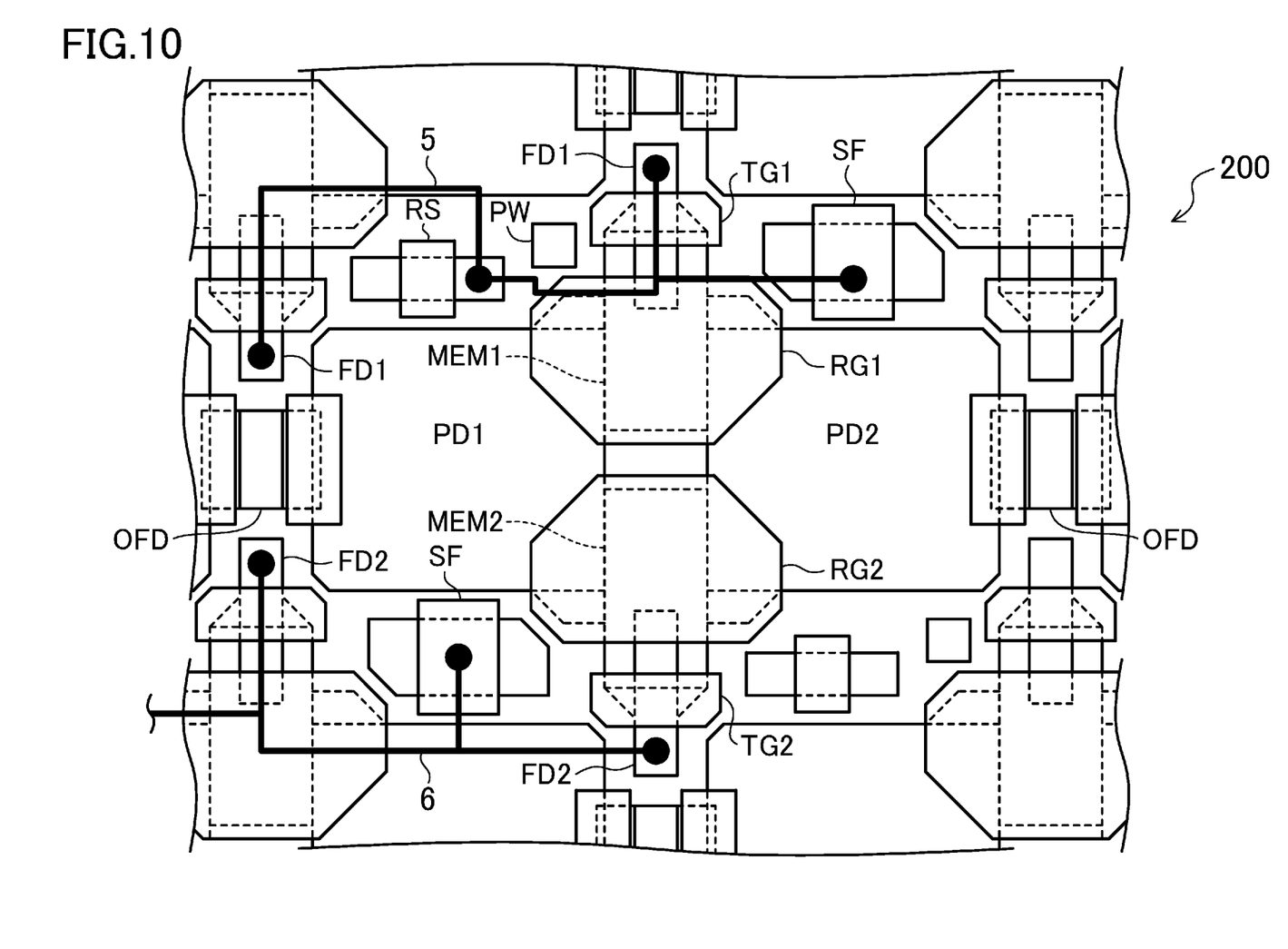
FIG. 10 is a plan view of a variation of the pixel structure shown in FIG. 1.

FIG. 10 is a plan view showing a variation of the pixel structure shown in FIG. 1. Just like the pixel 100 shown in FIG. 1, a pixel 200 shown in a central portion of FIG. 10 includes first and second photodiodes PD1 and PD2, first and second memories MEM1 and MEM2, first and second readout gates RG1 and RG2, overflow drains OFD, first and second floating diffusion portions FD1 and FD2, and first and second transfer gates TG1 and TG2. In FIG. 10, the first floating diffusion portion FD1 of the pixel 200, a first floating diffusion portion FD1 of one of pixels which are arranged in a staggered manner around the pixel 200 which is adjacent to the pixel 200 in the upper left direction in the drawing, the drain of a reset transistor RS, and the gate of a source follower SF are connected together through a metal interconnect 5. The second floating diffusion portion FD2 of the pixel 200, a second floating diffusion portion FD2 of another one of pixels which are arranged in a staggered manner around the pixel 200 which is adjacent to the pixel 200 in the lower left direction in the drawing, and the gate of a source follower SF are connected together through a metal interconnect 6.

According to the configuration shown in FIG. 10, connecting the source follower SF serving as an amplifier transistor for signal output to the first or second floating diffusion portions FD1 or FD2 of two adjacent pixels in common allows, for example, signals of charges accumulated in the first and second floating diffusion portions FD1 and FD2 of the pixel 200 to be output at the same time. Thus, a memory for temporarily storing data can be omitted from an arithmetic circuit at a subsequent stage.

Figure 11:
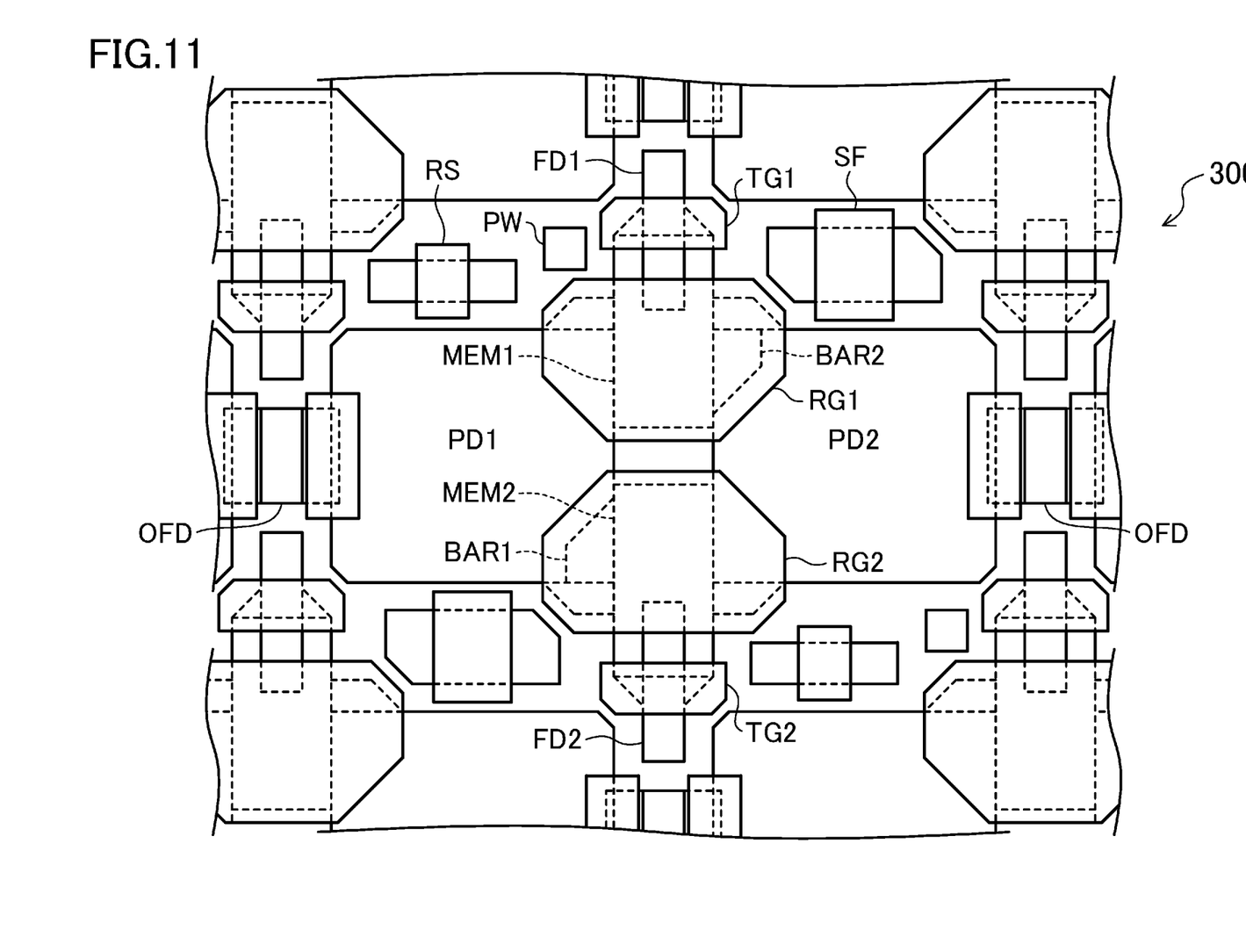
FIG. 11 is a plan view of a variation of the pixel structure shown in FIG. 1.

FIG. 11 is a plan view showing another variation of the pixel structure shown in FIG. 1. FIG. 11 shows an example in which the single pixel 100 in FIG. 1 is divided into two pixels 300 independent of each other. The reference character BAR1 in FIG. 11 denotes a first barrier formed, as a potential barrier, by ion implantation to prevent charge from being read from a first photodiode PD1 to a second memory MEM2. The reference character BAR2 denotes a second barrier formed, as another potential barrier, by ion implantation to prevent charge from being read from a second photodiode PD2 to a first memory MEM1.

According to the configuration shown in FIG. 11, charge generated by photoelectric conversion in the first photodiode PD1 can be read into only one of the first and second memories MEM1 and MEM2, i.e., the first memory MEM1, and charge generated by photoelectric conversion in the second photodiode PD2 can be read into only the other one of them, i.e., the second memory MEM2. Thus, the pixels 300 shown in FIG. 11 operate as two independent pixels to obtain a normal image. In addition, a set of the pixels 300 shown in FIG. 11 is identical to the pixel 100 shown in FIG. 1 except the presence of the first and second barriers BAR1 and BAR2. Thus, the set of the pixels 300 can be fabricated differently from the pixel 100 with ease.

Figure 12:
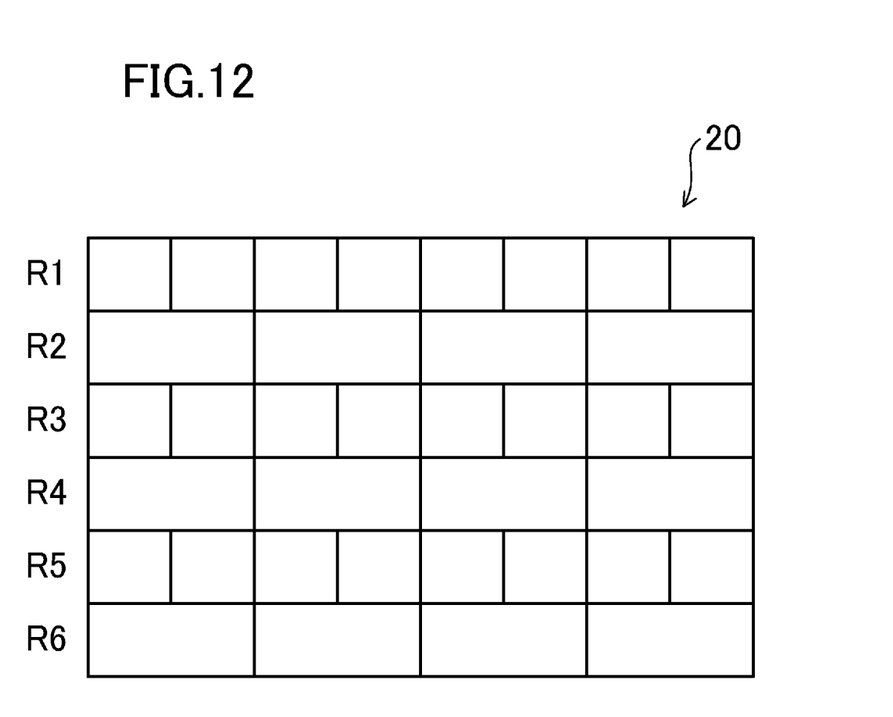
FIG. 12 is a plan view showing an exemplary imaging region including both the pixel shown in FIG. 1 and a set of pixels shown in FIG. 11.

FIG. 12 is a plan view showing an exemplary imaging region including both the pixel 100 shown in FIG. 1 and the set of the pixels 300 shown in FIG. 11. An imaging region 20 shown in FIG. 12 includes a plurality of pixels which are two-dimensionally arranged in a matrix. Odd-numbered ones R1, R3, and R5 of rows in the imaging region 20 each include such pixels 300 as shown in FIG. 11. These pixels are used to obtain a normal image, and are aligned with one another. On the other hand, even-numbered ones R2, R4, and R6 of the rows each include such pixels 100 as shown in FIG. 1. These pixels are used for distance measurement, and are aligned with one another. That is to say, two types of pixels are both disposed on a single semiconductor substrate. Thus, the application area of the solid state imaging device is expanded.

How the pixels 100 shown in FIG. 1 and the pixels 300 shown in FIG. 11 are arranged should not be limited to the example shown in FIG. 12. For example, the number of the pixels 100 shown in FIG. 1 or the pixels 300 shown in FIG. 11 may be increased. The type of the pixels does not need to vary from row to row, and may vary from column to column. Alternatively, the pixels may also be arranged in a special regular pattern. Thus, the pixels may be freely arranged.

As can be seen from the foregoing description, a solid state imaging device according to the present disclosure can improve the speed at which charge is read from a photodiode, and is useful as a solid state imaging device that can be used for distance measurement.

What is claimed is:

1. A solid state imaging device comprising a plurality of pixels which are two-dimensionally arranged on a semiconductor substrate,
   each of the pixels including:
      two photodiodes each generating charge by photoelectric conversion;
      first and second memories spaced apart from each other between the two photodiodes as viewed in cross section;
      a first readout gate reading charge from the two photodiodes to the first memory; and
      a second readout gate reading charge from the two photodiodes to the second memory.

2. The device of claim 1, wherein
the pixels are arranged on the semiconductor substrate in a staggered manner.

3. The device of claim 2, wherein
each of the pixels further includes:
   first and second floating diffusion portions adjacent to the first and second memories, respectively;
   a first transfer gate transferring charge from the first memory to the first floating diffusion portion;
   a second transfer gate transferring charge from the second memory to the second floating diffusion portion; and
   an amplifier transistor connected to, in common, the first or second floating diffusion portions of two adjacent ones of the pixels arranged in the staggered manner.

4. The device of claim 1, wherein
the first readout gate overlaps with borders between the first memory and the two photodiodes, and
the second readout gate overlaps with borders between the second memory and the two photodiodes.

5. The device of claim 1, wherein
each of the pixels further includes:
   first and second floating diffusion portions adjacent to the first and second memories, respectively;
   a first transfer gate transferring charge from the first memory to the first floating diffusion portion;
   a second transfer gate transferring charge from the second memory to the second floating diffusion portion; and
   an amplifier transistor connected to the first and second floating diffusion portions in common.

6. The device of claim 1, wherein
the two photodiodes each extend under the first and second memories.

7. The device of claim 1, wherein
the two photodiodes are connected together through a region under the first and second memories.

8. The device of claim 1, wherein
each of the pixels further includes:
   a first barrier formed as a potential barrier to prevent charge from being read from one of the two photodiodes to the second memory; and
   a second barrier formed as another potential barrier to prevent charge from being read from the other one of the two photodiodes to the first memory.

* * * * *

UNITED STATES PATENT AND TRADEMARK OFFICE
CERTIFICATE OF CORRECTION

PATENT NO. : 11,011,557 B2
APPLICATION NO. : 15/940658
DATED : May 18, 2021
INVENTOR(S) : Masahiro Oda It is certified that error appears in the above-identified patent and that said Letters Patent is hereby corrected as shown below:

In the Specification

Column 3, Line 31, delete "1-D1" and insert --FD1--.

Signed and Sealed this
Thirtieth Day of November, 2021

Drew Hirshfeld
*Performing the Functions and Duties of the*
*Under Secretary of Commerce for Intellectual Property and*
*Director of the United States Patent and Trademark Office*